United States Patent [19]

Sparks et al.

[11] Patent Number: 5,213,999
[45] Date of Patent: May 25, 1993

[54] METHOD OF METAL FILLED TRENCH BURIED CONTACTS

[75] Inventors: Douglas R. Sparks; John C. Christenson; James M. Himelick, all of Kokomo, Ind.

[73] Assignee: Delco Electronics Corporation, Kokomo, Ind.

[21] Appl. No.: 576,654

[22] Filed: Sep. 4, 1990

[51] Int. Cl.⁵ .................. H01L 21/44; H01L 21/48
[52] U.S. Cl. .................................. 437/203; 437/26; 437/31; 437/245
[58] Field of Search ............ 437/197, 198, 202, 203, 437/230, 245, 31, 26, 175, 177, 179

[56] References Cited

U.S. PATENT DOCUMENTS

| | | | |
|---|---|---|---|
| 3,887,993 | 7/1975 | Okada et al. | 437/200 |
| 4,562,640 | 1/1986 | Widmann et al. | 437/200 |
| 4,582,563 | 4/1986 | Hazuki et al. | 427/192 |
| 4,672,740 | 6/1987 | Shinai et al. | 437/197 |
| 4,720,908 | 1/1988 | Wills | 437/192 |
| 4,764,484 | 8/1988 | Mo | 437/192 |
| 4,851,369 | 7/1989 | Ellwanger et al. | 437/200 |

OTHER PUBLICATIONS

"Formulated Metallo-Organics", Engelhard Corporation, 1986.

Primary Examiner—Tom Thomas
Attorney, Agent, or Firm—Cary W. Brooks

[57] ABSTRACT

A trench capacitor within an integrated circuit is provided which is filled with solid elemental metal. This metal-filled trench capacitor is formed by the following steps. First a trench is conventionally formed within a silicon substrate. A dielectric film is then blanket deposited onto the substrate and within the trench, so that the walls and bottom surface of the trench are completely covered. A metal-containing liquid solution is next deposited within the trench, and heated to a temperature sufficient to thermally decompose the metal compound within the liquid solution and drive off any solvent from the solution, thereby leaving a plate of elemental metal within the trench capacitor. The metal-filled capacitor is accordingly characterized by high electrical conductivity. The method may also be utilized to form a metal contact to a buried layer within an integrated circuit; a rectifying contact or Schottky diode; contacts to the substrate; metal diffusion barrier layer; and interconnection metallization.

4 Claims, 4 Drawing Sheets

METHOD OF METAL FILLED TRENCH BURIED CONTACTS

This invention generally relates to integrated circuit manufacturing techniques. More particularly, this invention relates to a method for forming a trench capacitor suitable for use in a high density integrated circuit wherein a metal-containing liquid solution is utilized to form the trench capacitor.

BACKGROUND OF THE INVENTION

Currently, trench capacitors within an integrated circuit are made by filling the previously formed trench with appropriately doped polycrystalline silicon. A common method for depositing the polycrystalline silicon is by chemical vapor deposition techniques. The heavily doped polysilicon provides one of the conductive plates for the trench capacitor. A significant disadvantage associated with this present method is that the polysilicon has a relatively high electrical resistivity as compared to elemental metals. This high electrical resistivity accordingly limits the speed of the resulting device. In addition, the current deposition processes which are utilized to refill the trench with the polysilicon are extremely time consuming and expensive.

Therefore, it would be desirable to provide a trench capacitor within an integrated circuit, wherein the trench capacitor is metal-filled and accordingly characterized by relatively low electrical resistivity. It would be further desirable to provide a method for forming the trench capacitor which is not unduly time consuming or expensive.

SUMMARY OF THE INVENTION

It is an object of the present invention to provide a trench capacitor within an integrated circuit.

It is a further object of this invention that the trench capacitor be filled with an elemental metal and thereby be characterized by a relatively low electrical resistance.

It is still a further object of this invention to provide a method for forming such a trench capacitor.

In accordance with a preferred embodiment of this invention, these and other objects and advantages are accomplished as follows.

We are the first to provide a trench capacitor within an integrated circuit which is filled with solid elemental metal. This metal-filled trench capacitor is formed using the following steps. First a trench is conventionally formed within a silicon substrate. A dielectric film is then blanket deposited or thermally grown onto the substrate and within the trench, so that the walls and bottom surface of the trench are completely covered by the dielectric film. A metal-containing liquid solution is next deposited within the trench, and heated to a temperature sufficient to thermally decompose the metal compound within the liquid solution and drive off any solvent from the solution.

An inventive feature of this invention is that the thermal decomposition of the metal compound to the elemental metal results in a completely filled trench. This metal is then utilized as a highly conductive capacitor plate. Basically, the metal plate is formed by thermally decomposing a metal compound which has been applied to the silicon wafer in a liquid state. This method for forming a metal-filled trench capacitor within an integrated circuit is a simpler, faster and more practical process than conventional methods for forming the trench capacitor. In addition and more importantly, the resulting metal-filled trench capacitor is characterized by a significantly lower electrical resistivity therefore resulting in a much higher switching speed for the capacitor.

This method may also be utilized to form a metal contact to a buried layer, to form a rectifying contact (Schottky diode) to a silicon layer, or to form a metal diffusion barrier layer in a contact within an integrated circuit.

Other objects and advantages will be better appreciated from a detailed description thereof which follows.

BRIEF DESCRIPTION OF THE DRAWINGS

The above and other advantages of this invention will become more apparent from the following description taken in conjunction with the accompanying drawing wherein.

DETAILED DESCRIPTION

Figure 1:
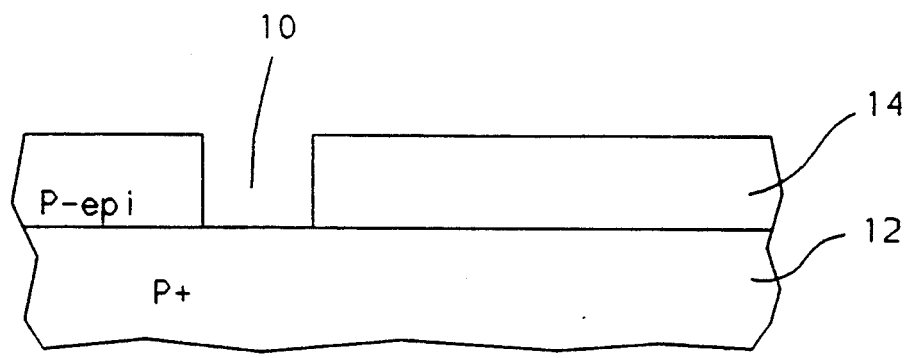
FIGS. 1 through 4 illustrate the processing steps for formation of a metal-filled trench capacitor in accordance with a preferred embodiment of this invention.

As shown in FIG. 1, a trench 10 is conventionally formed within a single crystal silicon substrate 12. For illustrative purposes only, the substrate 12 has been doped to be P+ type electrical conductivity. Suitable results may also be achieved using single crystal silicon which is characterized by N- type conductivity. The trench 10 is formed by masking the substrate 12 in those regions where the trench 10 is desired, and then growing epitaxial silicon 14 from the substrate 12. FIG. 1 illustrates the resulting trench 10 formation. Alternatively the trench 10 may be formed by masking the substrate 12 in those regions where the trench 10 is not desired, and then etching away the exposed regions of silicon 12 to form the trench 10, such as with reactive ion etching techniques.

Figure 2:
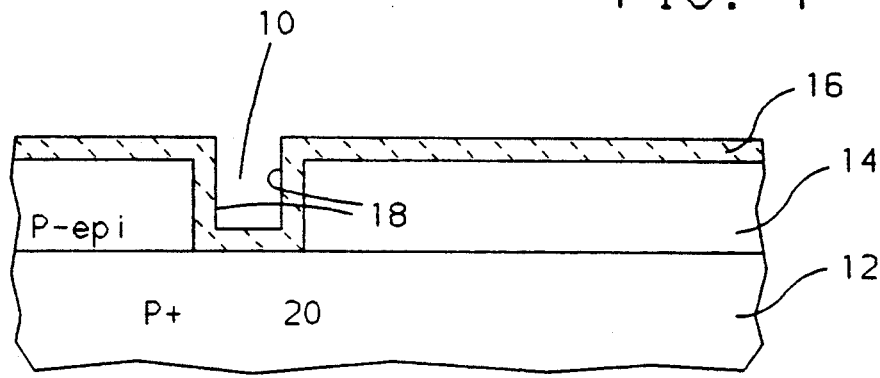

As shown in FIG. 2, a silicon oxide layer 16 is then grown from the silicon 12 and 14 to form the dielectric layer required within the desired trench capacitor. In a specific example, a silicon substrate 12 having an array of six microns deep by two microns wide trenches 10, were heated to about 1050° C. for a sufficient duration to grow an approximately 800 Angstroms thick oxide layer 16. The oxide layer 16 is grown on the walls 18 and bottom surface 20 of the trench 10, as well as the silicon 14. The oxide layer 16 may be grown to any practical thickness, depending on the width and physical dimensions and electrical characteristics of the desired capacitor. Alternatively, an appropriate dielectric film may be deposited on the silicon substrate instead of thermally growing the silicon oxide.

Figure 3:
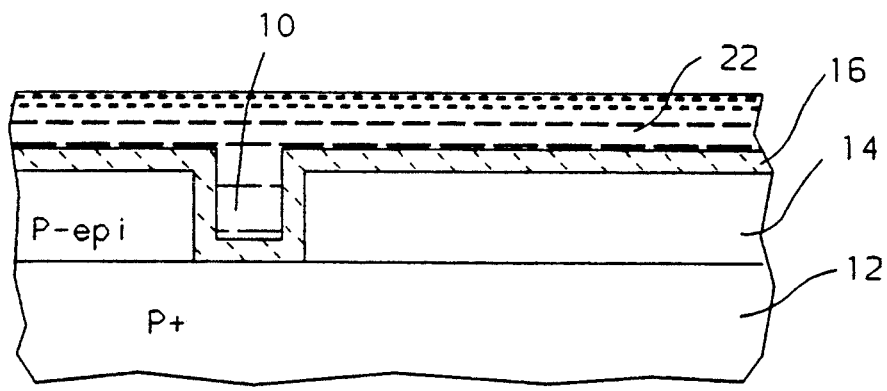

As depicted in FIG. 3, a metal-containing liquid 22 is then applied to the silicon 14 so as to fill the previously formed trench 10. The metal-containing solution 22 may be spun-on, sprayed or screen-printed onto the silicon 14 though not limited to these application techniques, so long as the deposition method results in complete filling within the trench 10 with the liquid solution 22. The spin-on process may be preferential since it causes the metal-containing liquid solution 22 to settle into the trench 10 regions and other regions, such as contacts or interconnecting vias, while substantially planarizing the silicon 14 topography. The spin speed may be varied, as well as the liquid solution 22 composition, to vary the thickness, viscosity and filling characteristics of the spun-on solution 22.

In the specific example, a liquid solution 22 of about 10 to 15 weight percent silver (a saturated solution of silver nitrate, $AgNO_3$, in water) was used. The solution 22 was of an appropriate viscosity to be spun-onto the dielectric 16 layer on top of the silicon 14 and into the trench 10. After the silver nitrate liquid solution 22 was spun-on, the substrate 12 was heated to a temperature and duration sufficient to evaporate the water from the liquid solution 22, specifically about 60° C. for about 10 minutes. This step is not necessary since subsequent annealing occurs at an even higher temperature, however it is preferred since it makes handling and subsequent processing of the wafer easier.

Although silver nitrate in water was utilized in the specific example, other metal-containing liquid solutions may also be utilized. They include, but are not limited to:

about 10–15 weight percent silver as silver neodecanoate in alpha-terpineol, ethyl carbitol may be added as a thickener to ensure complete and thorough coating on the substrate surface and trench surfaces;

about 19.7 weight percent copper as copper nitrate trihydrate in water (thermal decomposition temperature about 650° to 850° C.), in a forming gas ambient;

about two weight percent palladium as palladium octoate in toluene, methyl acrylate may be added as a thickener;

about eight weight percent palladium as palladium-mercaptan in toluene (thermal decomposition temperature about 700° to 800° C.);

about 28 weight percent gold as gold mercaptan in toluene (thermal decomposition temperature about 800 to 850° C.);

about 18 weight percent gold as gold amineoctoate in toluene;

about 18 weight percent platinum as platinum amineoctoate in toluene; and about nine weight percent platinum as platinum mercaptan in toluene.

The thermal decomposition temperature is at least about 450° C., except where noted.

In addition, a surfactant may be added to the metal-containing liquid solution 22 to improve the wetting of the silicon oxide 16 or dielectric film so as to ensure good adhesion between the dielectric layer 16 and the metal within the trench 10. In the specific example, a sufficient amount of surfactant, alkyl aryl polyether alcohol, was added to improve the wetting characteristics of the silicon oxide layer 16. Other suitable surfactants may also be utilized.

Figure 4:
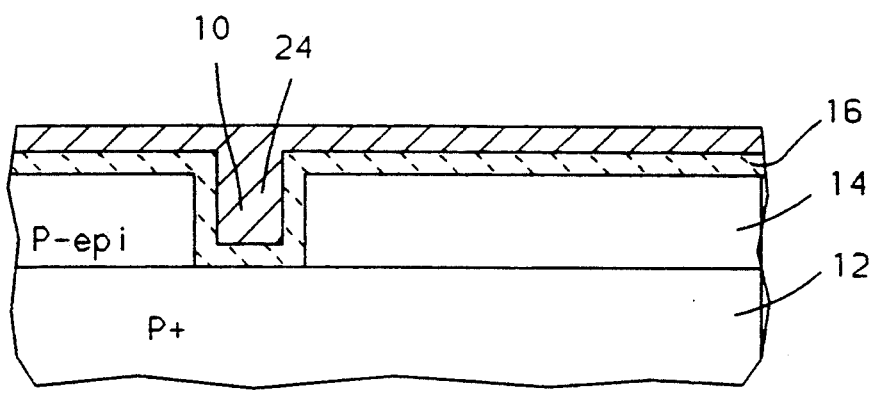

The substrate 12 is then heated to a temperature sufficient to thermally decompose the metal compound within the liquid solution 22 into its elemental metal, but insufficient to degrade the other components. As depicted in FIG. 4, the elemental metal 24 remains within the trench 10 after this heating step.

In the specific example, the silicon substrate 12 was heated in air to a temperature of at least about 450° C. for a duration sufficient to thermally decompose the silver nitrate compound into elemental silver and volatile gases. The temperature may vary between about 450° to 725° C. for effecting the thermal decomposition without causing any undesirable effects. The duration at this temperature may be just a matter of a few minutes, although longer durations will not cause degradation of the components.

In the specific example, the solid silver nitrate within the liquid solution melts at about 220° C., therefore heating to a temperature greater than this, causes the metal compound to decompose and flow. This results in further filling and planarizing of the trenches prior to the actual decomposition of the metal compound. In addition, when the substrate is heated to above about 650° C., any nitrate related residues on the substrate surface or within the trench are volatized. The resulting trench is completely filled with elemental silver and is characterized by high electrical conductivity or correspondingly low electrical resistivity.

A standard scotch tape test was utilized to evaluate the metal adhesion to the silicon oxide. Excellent adhesion between the silver metal and the silicon oxide, as well as between the silver metal and silicon regions, was observed, since no silver was removed from the surfaces by the tape.

After the metal-filled trench has been formed with this method, conventional metal etching may be utilized to pattern the metal on the top surface of the silicon substrate so as to interconnect adjacent trenches or other components. Alternatively, the metal may be completely removed to isolate the metal-filled trenches within the integrated circuit.

Figure 5:
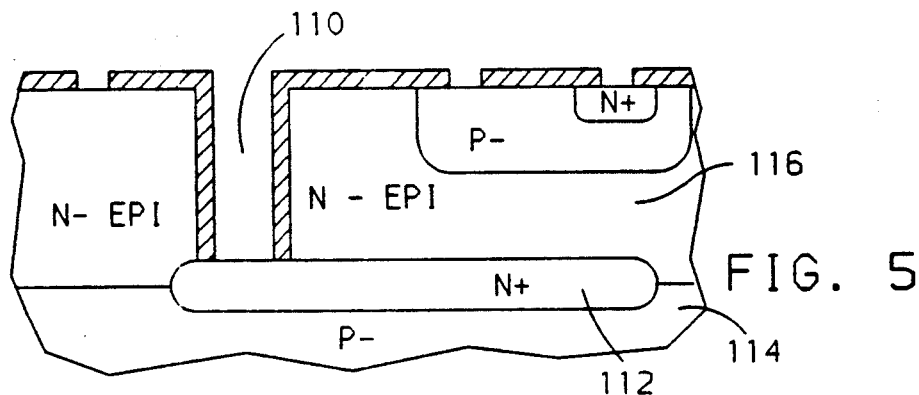
FIGS. 5 through 8 illustrate the processing steps for formation of a metal contact to a buried layer within an integrated circuit in accordance with a preferred embodiment of this invention.
Figure 6:
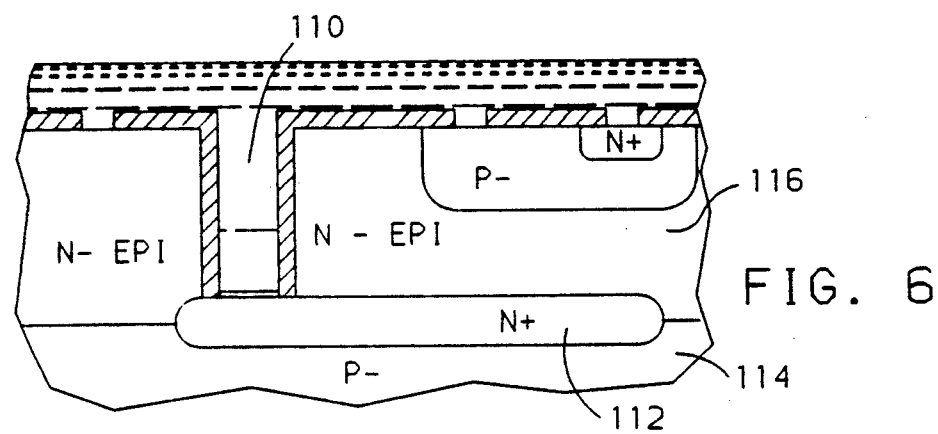
Figure 7:
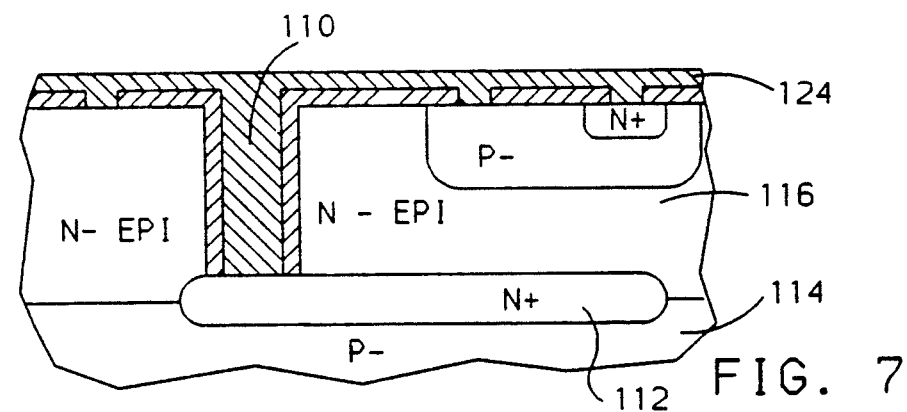
Figure 8:
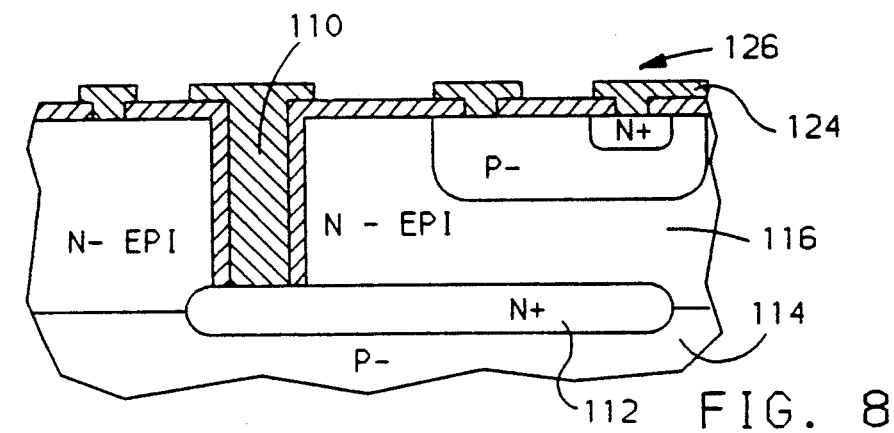

This method may also be utilized to fill a trench 110 with elemental metal so as to contact a buried layer 112 within an integrated circuit and to form a rectifying contact or Schottky diode, contacts to the substrate, and interconnect metallization simultaneously, as shown in FIGS. 5 through 8. A silicon substrate 114 which has illustratively been doped to be of P— type conductivity is provided, and includes an N+ type NPN emitter diffusion and a P— type NPN base diffusion. An N+ type buried layer 112 was formed between a layer 116 of N— type epitaxial silicon and the substrate 114. Trench 110 was formed within layer 116 of N— type epitaxial silicon, as shown in FIG. 5. The desired metal-containing liquid 122 is applied to the silicon 116 and within the trench 110, as shown in FIG. 6. The metal-containing liquid solution 122 is thermally decomposed at the appropriate temperature to its elemental metal. The thermal decomposition causes the elemental metal 124 to remain on the silicon 116 and within the trench 110, so as to contact the buried layer 112, as shown in FIG. 7. FIG. 8 depicts an example of a bipolar NPN 126 having the metal contact 124 to the buried layer 112, wherein the elemental metal on the surface of the silicon has been removed. It may be appreciated that other devices such as an up-drain DMOS device may have buried diffusions contacted in a like manner. Since the metal contact 124 is elemental metal, the electrical conductivity of the contact 124 is significantly higher than conventionally used polycrystalline silicon or silicon plug.

Figure 9:
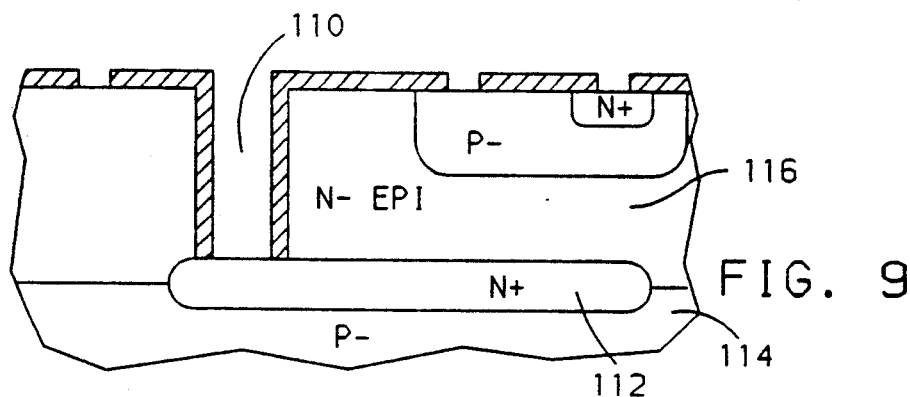
FIGS. 9 through 16 illustrate the processing steps for formation of a metal diffusion barrier layer between appropriately prepared substrate layers within an integrated circuit in accordance with a preferred embodiment of this invention.
Figure 10:
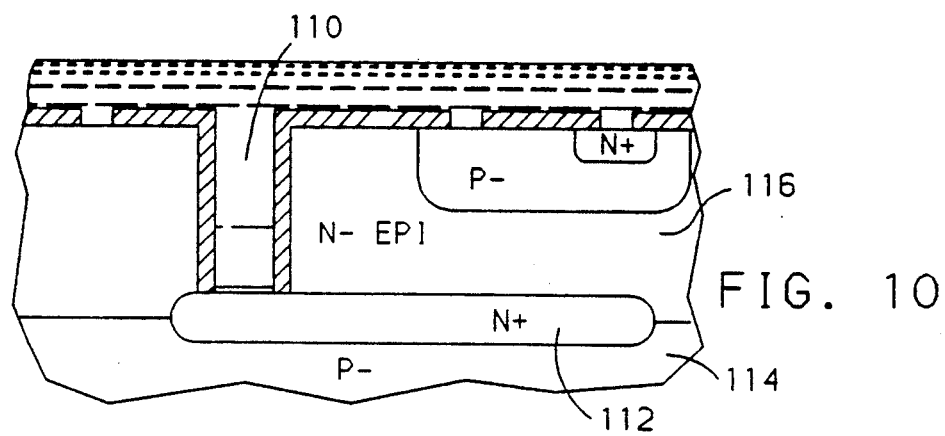
Figure 11:
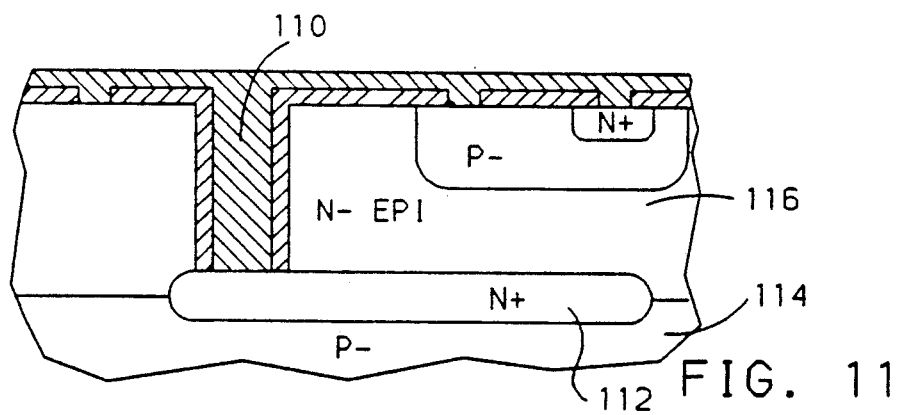
Figure 12:
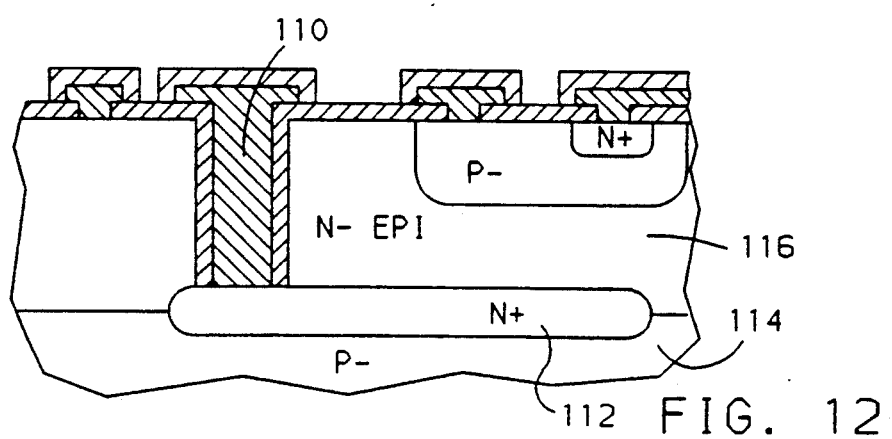
Figure 13:
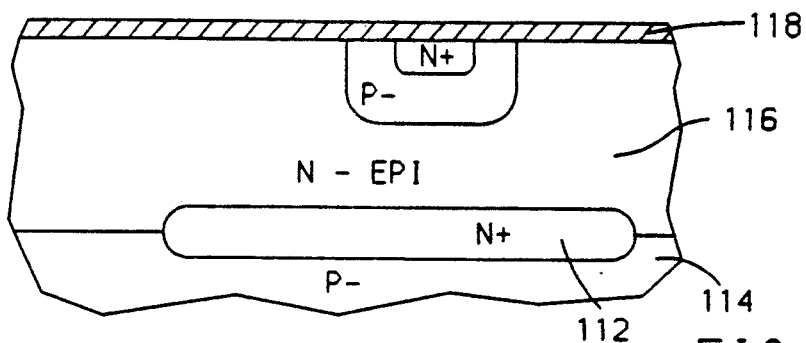
Figure 14:
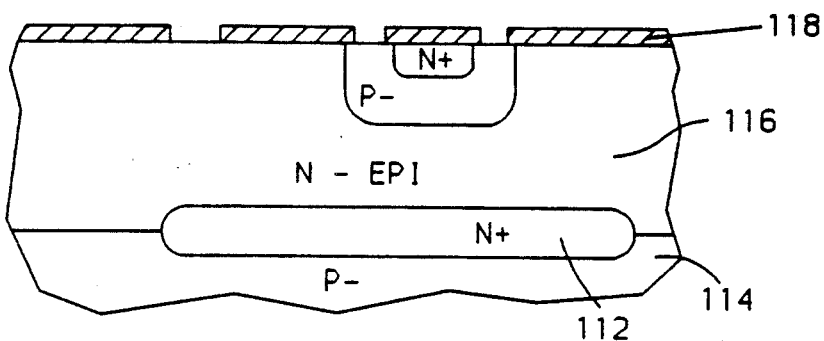
Figure 15:
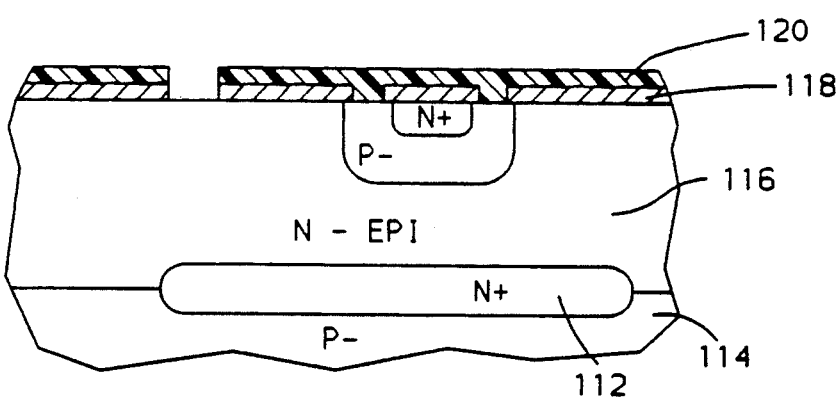
Figure 16:
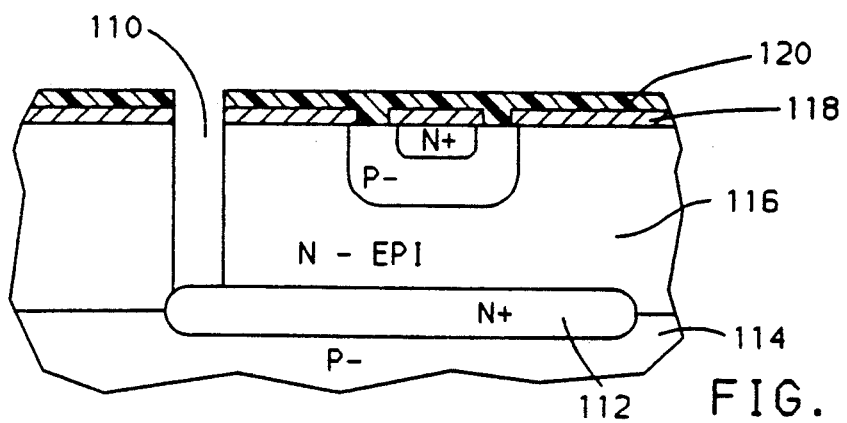

This method may also be utilized to form metal diffusion barrier layers between the semiconductor and the interconnect metal. FIG. 9 shows a silicon substrate 114 which has illustratively been doped to be of P− type conductivity. An N+ type buried layer 112 was formed between a layer 116 of N− type epitaxial silicon and the substrate 114. A trench 110 has been etched through the N− type epitaxial silicon layer 116 to the N+ type buried layer 112. In addition, a P− type base region and an N+ emitter region of an NPN transistor have been formed. A dielectric film was patterned such that it left open areas in each of the N+ buried layer 112, the NPN emitter and base. The desired barrier metal-containing liquid is applied to the silicon emitter and base areas and within the trench 110, as shown in FIG. 10. The barrier metal-containing liquid solution is thermally decomposed at the appropriate temperature to its elemental metal. The thermal decomposition causes the elemental barrier metal to remain on the open substrate emitter and base areas, in the trench 110, and upon the top surface of the dielectric, as shown in FIG. 11. The barrier metal is then etched off of the dielectric surface. An interconnect metal is then deposited and patterned on top of the dielectric layer and the barrier metal, shown in FIG. 12.

With this method, an integrated circuit having a trench filled with elemental metal is formed. The resulting devices are characterized by higher electrical conductivity and therefore faster switching speeds. In addition, this method easily facilitates modifications to the desired materials and device design.

While the invention has been described in terms of a preferred embodiment, it is apparent that other forms could be adopted by one skilled in the art, such as by modifying the preferred metal-containing liquid solution or processing parameters. Accordingly, the scope of this invention is to be limited only by the following claims.

The embodiments of the invention in which an exclusive property or privilege is claimed are defined as follows:

1. A method of making a metal contact to a buried layer comprising the following steps:
   providing a substrate having a doped region of P− type conductivity, an N+ type buried layer formed between said P− type region and an N− type epitaxial silicon;
   providing a dielectric layer on said substrate;
   patterning said dielectric layer such that predetermined areas of said substrate are exposed;
   masking said dielectric layer and certain portions of said exposed substrate areas;
   forming a trench in unmasked and exposed substrate areas through said N− type epitaxial silicon layer to said N+ type buried layer;
   providing a dielectric material on the trench surfaces so that an opening is provided to said N+ type buried layer;
   depositing a metal-containing liquid solution on said dielectric layer, in said trench, and into said exposed substrate areas so as to fill completely said trench, said exposed substrate areas and uniformly coat said dielectric layer;
   heating said metal-containing liquid solution to a temperature sufficiently high enough to decompose metal-containing liquid solution such that the metal within said metal-containing liquid solution remains within said trench, on said exposed substrate areas, and upon said dielectric layer to form a metal layer; and
   patterning said metal layer to form interconnections.

2. A method as recited in claim 1 wherein the substrate is silicon.

3. A method as recited in claim 1 wherein the substrate is doped polysilicon.

4. A method as recited in claim 2 wherein said metal-containing solution comprises platinum mercaptan and toluene.

* * * * *